US011262387B2

(12) United States Patent
Mahoney et al.

(10) Patent No.: US 11,262,387 B2
(45) Date of Patent: Mar. 1, 2022

(54) TEST POINT VOLTAGE SENSOR FOR HIGH VOLTAGE SEPARABLE CONNECTORS

(71) Applicant: 3M INNOVATIVE PROPERTIES COMPANY, St. Paul, MN (US)

(72) Inventors: David V. Mahoney, Austin, TX (US); Carl J. Wentzel, Austin, TX (US); Shuguang Wu, Austin, TX (US); Laszlo Markos, Austin, TX (US); Andrew C. Lottes, Austin, TX (US); James S. McHattie, Austin, TX (US); Christopher R. Wilson, Austin, TX (US); Richard D. Twigg, Leander, TX (US); Pete D. Jordan, Cedar Creek, TX (US); Sean C. Davis, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 197 days.

(21) Appl. No.: 16/585,803

(22) Filed: Sep. 27, 2019

(65) Prior Publication Data

US 2020/0110114 A1   Apr. 9, 2020

Related U.S. Application Data

(60) Provisional application No. 62/740,710, filed on Oct. 3, 2018.

(51) Int. Cl.
*G01R 15/16* (2006.01)
*G01R 1/04* (2006.01)
(Continued)

(52) U.S. Cl.
CPC ......... *G01R 15/165* (2013.01); *G01R 1/0416* (2013.01); *G01R 15/06* (2013.01); *G01R 19/145* (2013.01); *H01R 2201/20* (2013.01)

(58) Field of Classification Search
CPC .............. G01R 1/0408; G01R 31/2808; G01R 31/2818; G01R 31/66
See application file for complete search history.

(56) References Cited

U.S. PATENT DOCUMENTS 4,814,933 A * 3/1989 Filter ..................... G01R 15/22
324/133
5,077,520 A   12/1991 Schweitzer, Jr.
(Continued)

FOREIGN PATENT DOCUMENTS

DE   10 2017 000 723 A1   8/2018
FR        2 788 857 A1   7/2000
(Continued)

OTHER PUBLICATIONS

International Search Report for Appl. No. PCT/IB2019/025245, dated Dec. 2, 2019, 4 pp.

*Primary Examiner* — Tung X Nguyen
(74) *Attorney, Agent, or Firm* — Gregg H. Rosenblatt

(57) ABSTRACT

A device to measure the voltage at a test point, also referred to as a test point voltage sensor, comprises a housing formed from a first material and a second material, wherein the first material comprises an insulating material and the second material comprises a conductive or semiconductive material. The housing includes an opening configured to cover a test point of a cable accessory. The device further includes a pressure pad, disposed in the housing, having a conductive mating surface configured to contact a test point of the basic insulation plug or end plug. The device further includes a low side capacitor embedded in the housing and electrically coupled to the conductive mating surface. The device further includes a signal wire electrically coupled to the low side capacitor.

18 Claims, 6 Drawing Sheets

(51) Int. Cl.
  *G01R 15/06*  (2006.01)
  *G01R 19/145*  (2006.01)

(56) References Cited

U.S. PATENT DOCUMENTS

2011/0025342 A1* 2/2011 Siebens ................ G01R 15/165
                                          324/538
2015/0004843 A1* 1/2015 Siebens .................. H01R 13/53
                                          439/625

FOREIGN PATENT DOCUMENTS

| KR | 10-2008-0024646 A | 3/2008 |
| KR | 10-2012-0139670 A | 12/2013 |
| WO | WO 2016-033443 | 3/2016 |
| WO | WO 2018-211358 | 11/2018 |

* cited by examiner

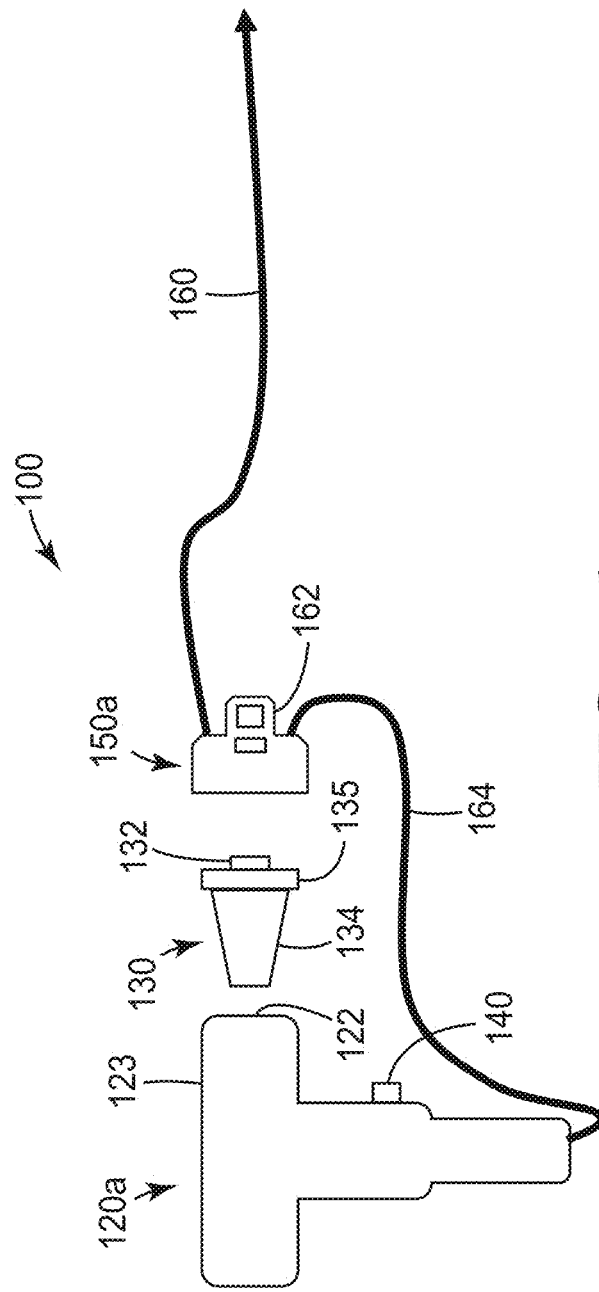

TEST POINT VOLTAGE SENSOR FOR HIGH VOLTAGE SEPARABLE CONNECTORS

This disclosure relates to sensors for high voltage and, in particular, relates to sensors for high voltage separable connectors which may provide a low voltage signal corresponding to a high voltage signal present in a separable connector.

BACKGROUND

As electrical power distribution becomes more complex through the advent of renewable energy, distributed generation, and the adoption of electric vehicles, intelligent electrical distribution and associated electrical sensing is becoming more useful and even necessary. Useful sensing may include voltage, current, and the time relationship between voltage and current at various locations within a power distribution network.

Traditionally, the power has been generated at a central location, and then distributed radially from the generation facility. As the development of the power grid matures, and more renewable energy is involved, the power flow in the distribution grid becomes less obvious, i.e., no longer simply flowing away from primary generation stations. Too, customers are becoming much more aware of power quality in regards voltage, harmonics, real/imaginary power magnitudes, etc.

Many existing relatively high voltage transformers and switchgears have a dedicated space for cable accessories, particularly in higher voltage applications (for example, 5 kV to 69 kV, or higher). Many of these transformers and switchgear are of a variety referred to in the power utility industry as dead-front. Dead-front means there are no exposed relatively high voltage surfaces in the connection between a power cable and the transformer or switchgear. Such cable accessory connections are sometimes referred to as elbows, T-bodies, or separable connectors.

Many cable accessories implement testpoints to provide a limited energy signal that could be transformed into a scaled fraction of the line voltage residing on the shielded and insulated conductor of the cable accessory. The historical use of these test points is for indication of the presence of line voltage at the transformer or switchgear.

The need to develop and provide voltage and current and power quality sensing at the distribution grid is increasing rapidly due to substantial change in the global power grid structure. With the advent of more power electronics which often incorporate high frequency switching in their power supplies, the injection of noise in the power grid is increasing. Because of these and other issues in the evolving grid, the need for sensing and sensors at the distribution level is increasing.

SUMMARY

In one embodiment of the present invention, a device for measuring the voltage at a test point, also referred to as a test point voltage sensor, comprises a housing formed from a first material and a second material, wherein the first material comprises an insulating material and the second material comprises a conductive or semiconductive material. The housing includes an opening configured to cover a test point of a cable accessory. The device further includes a pressure pad, disposed in the housing, having a conductive mating surface configured to contact a test point of the basic insulation plug or end plug. The device further includes a low side capacitor embedded in the housing and electrically coupled to the conductive mating surface. The device further includes a signal wire electrically coupled to the low side capacitor.

It is to be understood that both the foregoing general description and the following detailed description present embodiments of the subject matter of the present disclosure, and are intended to provide an overview or framework for understanding the nature and character of the subject matter of the present disclosure as it is claimed.

BRIEF DESCRIPTION OF THE DRAWINGS

FIG. 1A is an exploded schematic view of a test point voltage sensor to be deployed on a separable connector according to a first aspect of the present invention.

Figure 1B:
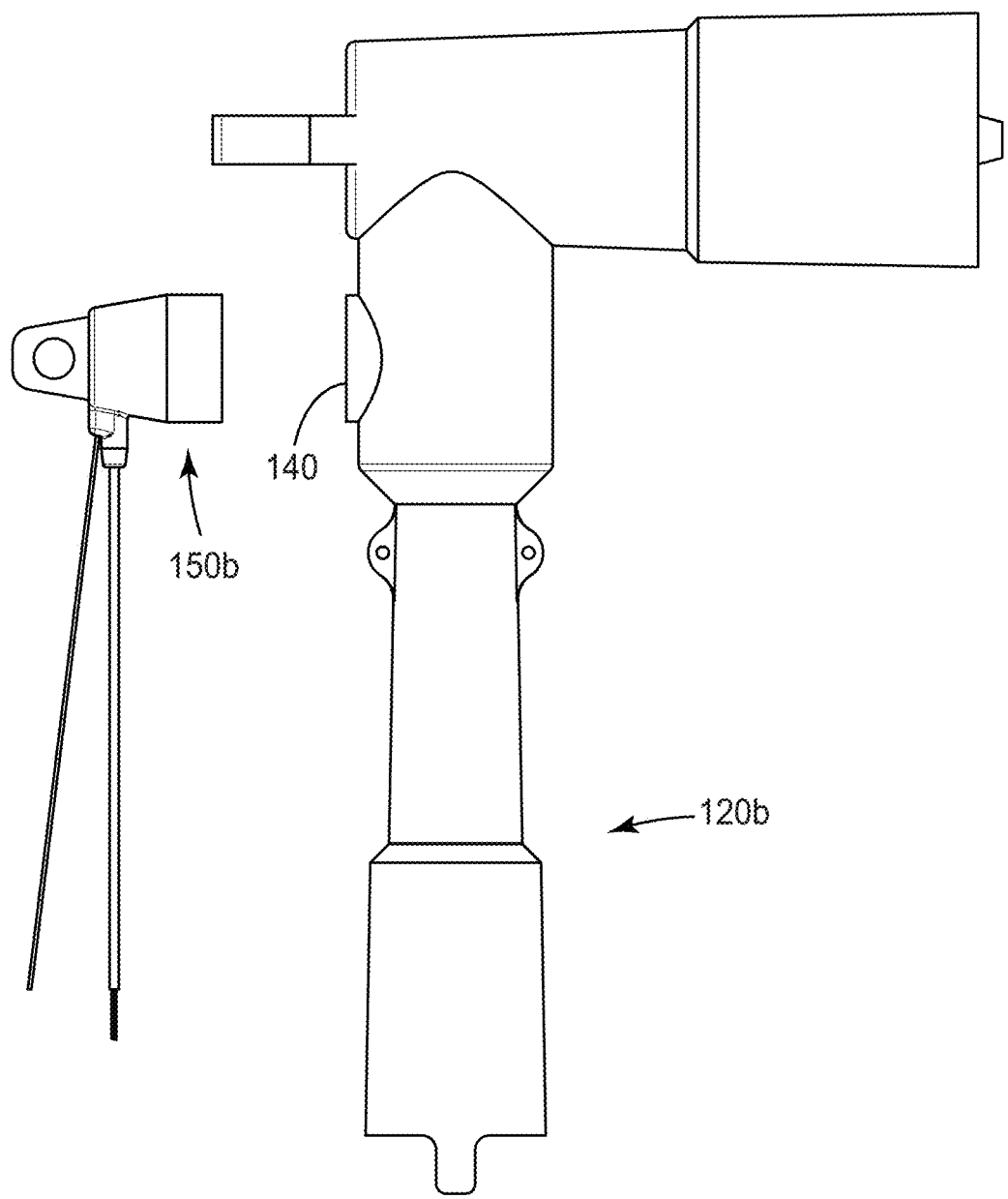
FIG. 1B is an exploded schematic view of another test point voltage sensor to be deployed on another separable connector according to another aspect of the present invention.

The disclosure may be more completely understood in consideration of the following detailed description of various embodiments of the disclosure and the accompanying drawings.

DETAILED DESCRIPTION

The present disclosure provides a device for measuring voltage at a test point, also referred to as a 'test point voltage sensor' (TPVS) that provides voltage and/or power quality sensing at a point of the distribution grid, such as at a separable connector. The test point voltage sensor can be installed and utilized at a point on the distribution grid without the need for a service technician/utility to take an outage. For example, an existing insulating plug cover can be removed from a separable connector, such as a T-body, using a hot stick, and TPVS may be installed on that same location using a hot stick, so that there is no power interruption. The test point voltage sensor is similar in shape to a standard T-body protective cap or cover on the insulation plug, but the TPVS cap or cover can electrically connect to the metallic hex feature on the insulating plug, reduce the voltage using a capacitive voltage divider within the TPVS cap, and using wires, can provide a periodic or continuous low voltage signal for grid measurement analysis. The output of the TPVS is a low voltage signal that is sufficient for an analytics system to sense the presence of voltage, sense the time/phase relationship of the voltage signal, provide information on faults (voltage spikes, drops), and with some calibration (whether automated or manual), may provide reasonably accurate voltage output to better measure the cable voltage. A voltage reading can be taken using the test point voltage sensor, while a current can be measured using an additional sensor, e.g., a Rogowski coil. Both voltage and current can be connected to a monitoring computer or an analytics unit, such as a sensor analytics unit.

The term "high voltage" as used herein means a voltage equal to or greater than a high voltage threshold. The high voltage threshold may be based on a standard, jurisdictional requirement, or end-user requirement that applies to the particular system being described. For example, high voltage may refer to operating at about the voltage rating defined in a standard, such as the Institute of Electrical and Electronics Engineers (IEEE) Standard 386 (2016) for separable insulated connector systems for power distribution systems rated 2.5 kV through 35 kV (classified as phase-to-phase root-mean-square, or rms), which is incorporated herein by reference for any and all purposes. Depending on the application, the high voltage threshold may be equal to or greater than about 2.5 kV, about 3 kV, about 5 kV, about 15 kV, about 25 kV, about 28 kV, about 35 kV, about 69 kV, or more (classified as phase-to-phase rms).

The term "low voltage" as used herein means a voltage that is less than the high voltage. Low voltage may be defined at or below a low voltage threshold. The low voltage threshold and the high voltage threshold may be the same threshold or a different threshold. A low voltage may be a fraction, or ratio less than 1, of a high voltage. The low voltage may be defined by a threshold fraction, or ratio (for example, less than or equal to about 1:100). Unless otherwise stated in the disclosure herein, low voltage is described using phase-to-ground rms.

The term "separable connector" as used herein means a connection or interface for a high voltage system that can be readily established or broken by engaging or separating the connection at an operating interface. Separable connectors may be fully insulated and shielded and used to terminate and insulate a power cable, insulate another electrical component, or connect an insulated power cable to electrical apparatus, other power cables, or both. Separable connectors may be connected to transformers or switchgears. Some separable connectors may be used for deadfront transformers and switchgears, which refers to having no exposed high voltage surfaces in the connector between a power cable and the transformer or switchgear in the power utility industry. Non-limiting examples of separable connectors include elbow separable insulated connectors and tee separable insulated connectors (for example, a T-Body).

The term "voltage rating" as used herein means a maximum voltage at which a connector is designed to operate. The voltage rating may be measured as the highest phase-to-ground voltage rms for single phase systems or may be measured as the highest phase-to-ground and phase-to-phase voltage rms for three-phase systems. However, any suitable type of voltage rating may be used to describe a maximum operational voltage. Unless otherwise stated in the disclosure herein, voltage rating refers to phase-to-ground rms.

The term "connection" as used herein means an interface, a connector, or other structure used to electrically or mechanically couple components together. For example, a connection may include a plug or socket, a wire, a cable, a conductor on a substrate, a piece of solder, a conductive via, or other similar electrical or mechanical coupling.

The terms "coupled" or "connected" refer to elements being attached to each other either directly (in direct contact with each other) or indirectly (having one or more elements between and attaching the two elements).

Figure 2:
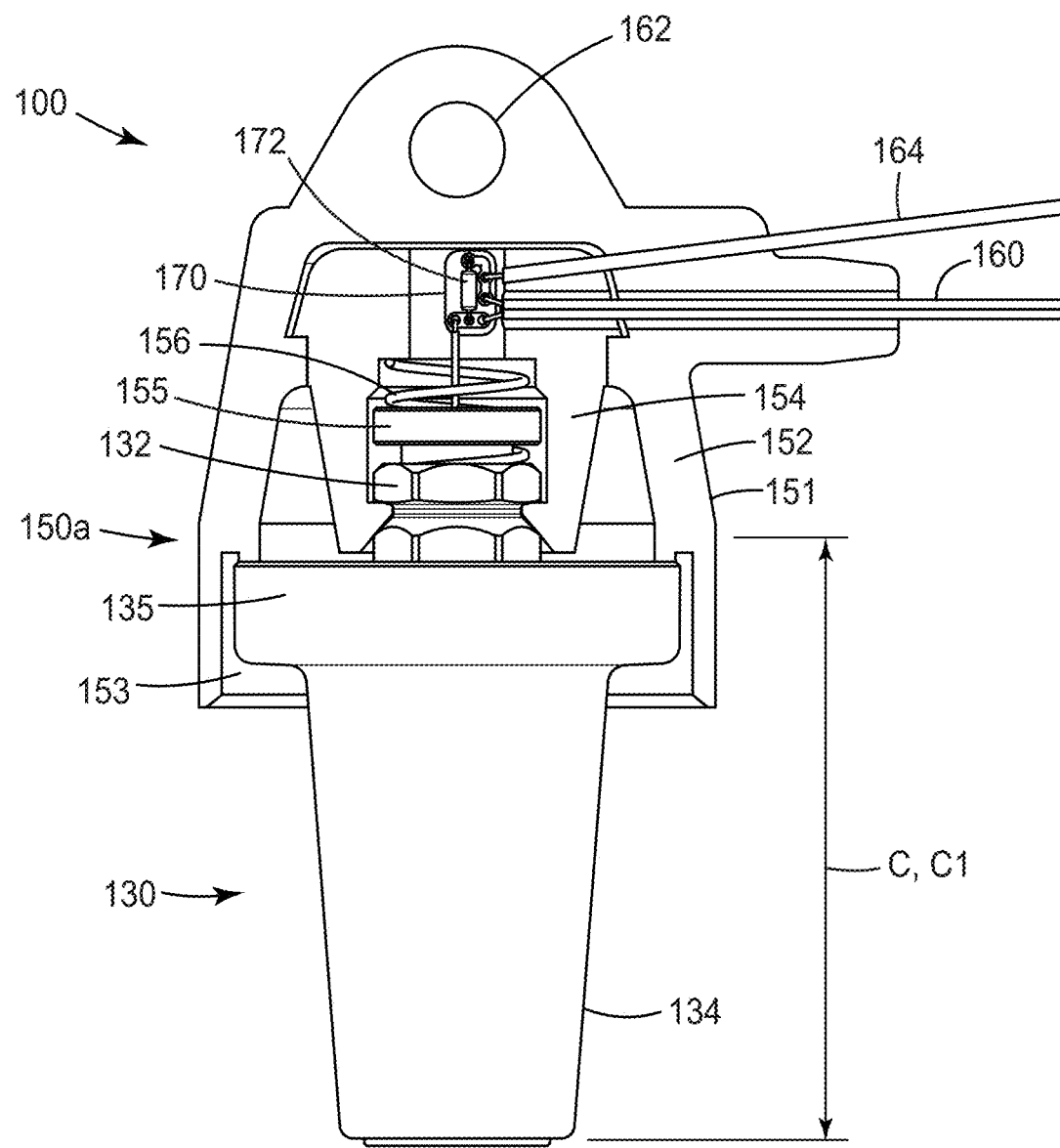
FIG. 2 is a cross section view of a test point voltage sensor installed on a basic insulation plug according to another aspect of the present invention.
Figure 3:
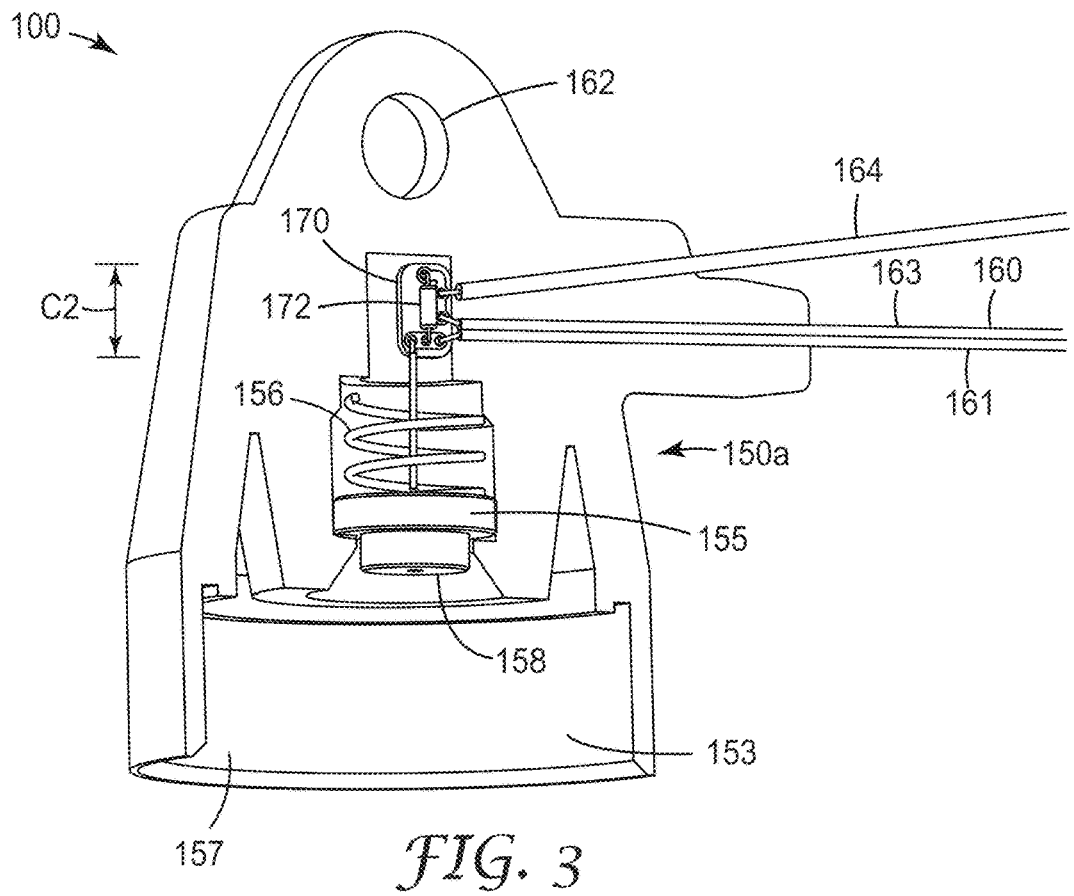
FIG. 3 is a close up cross section view of an exemplary test point voltage sensor according to another aspect of the present invention.
Figure 4:
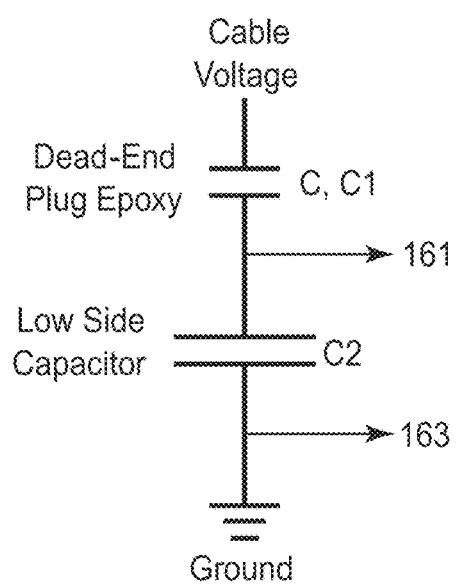
FIG. 4 is a schematic diagram of the voltage divider circuit according to another aspect of the present invention.

FIGS. 1A-1C show exploded schematic views of a test point voltage sensor to be deployed on a separable connector. FIG. 2 shows a cross section view of a test point voltage sensor 100 installed on a basic insulation plug. FIG. 3 shows a close up cross section view of an exemplary test point voltage sensor. FIG. 4 shows a schematic diagram of the voltage divider circuit established when connecting a test point voltage sensor to a basic insulation plug installed on a separable connector located on the distribution grid.

As shown in FIG. 1A, a voltage measurement system 100 includes a test point voltage sensor (TPVS) 150a can be installed on a high voltage separable connector, such as separable connector 120a, that is deployed at a location on a power distribution grid. The separable connector 120a in this example comprises a T-Body. In alternative embodiments, the TPVS can be installed on any suitable separable connector, such as an elbow separable insulated connector. The separable connector 120a may include one, two, or more receptacles (for example, in a T-Body).

In the exemplary embodiment of FIG. 1A, the TPVS 150a can mate with an IEEE 600A T-body having a basic insulating plug (BIP), with a test point, inserted in a receptacle therein. As discussed below, the BIP 130 can be a conventional BIP or it can be a modified BIP, having one or more capacitors disposed therein. In further alternative aspects, the TPVS can be configured to be deployed for different voltage classes, IEC devices, etc., including a TPVS that may attach to an integrated test point of a 200A "elbow" or an integrated test point of a 600A T-body.

In another example, a TPVS can mate with an IEEE 600A T-body 120a at an integrated test point 140.

In another example, in FIG. 1B, a TPVS 150b can mate with an integrated test point 140 of a 200A "elbow" 120b.

Referring back to FIG. 1A, separable connector 120a includes a receptacle 122 that receives a basic insulating plug (BIP) or end plug 130. The BIP 130 includes a tapered insertion end 134 and a contact point 132, such as a lug or hex head nut, on the other end of BIP 130. The BIP 130 can comprise a conventional BIP, formed from an insulating resin or other insulating polymer, such as is widely commercially available. Alternatively, BIP or end plug 130 can be a modified end plug with one or more integrated discrete capacitors disposed therein.

In this aspect, the TPVS 150a is shaped as a cover or an end cap that is shaped to fit over the head portion 135 of BIP 130 and outer surface 123 of cable accessory receptacle 122. As shown in more detail in FIG. 2, TPVS 150a includes an opening 153 configured to snuggly fit, e.g., via friction fit, over BIP end 135. In addition, the inner diameter of TPVS 150a is configured such that flange portion 157 (see FIG. 3) snuggly fits over the outer surface 123 of the cable accessory receptacle that receives BIP 130.

An electrical contact is made between a pressure pad 155 and contact point 132 via a conductive mating surface 158 (see FIG. 3) formed on the contact surface of pressure pad 155. The electrical contact between contact point 132 and mating surface 158 of pressure pad 155 is maintained with a suitable compression force, such as is provided by spring 156. In addition, the conductive mating surface 158 of pressure pad 155 can include a plurality of surface features, such as sharpened protrusions, that are configured to break through any oxidation layer formed on the surface of the contact point 132.

As mentioned above, in alternative aspects the TPVS can also be configured to engage an integrated test point, such as test point 140, of cable accessory 120a or 120b. In these embodiments, TPVS 150b has a smaller housing configured to mate with a smaller test point 140. The same or similar components included in TPVS 150a can be included in TPVS 150b.

The housing of TPVS 150*a* can be formed using an appropriate insulating material, such as EPDM or silicone rubber. As shown in FIG. 2, in this aspect, TPVS is formed from a material having an insulating portion 154 and a conductive or semiconductive portion 152. In this embodiment, the outer conductive/semiconductive portion 152 of TPVS 150*a* comprises a conductive EPDM rubber, and the inner insulating portion comprises an insulating EPDM rubber. In one aspect, the conductive EPDM portion 152 can be over-molded onto the insulating EPDM portion 154. Alternatively, the main body of TPVS 150*a* can be formed from an insulating silicone material, with the outer surface and the mating inner ring coated with a conductive coating to provide for safety and shielding.

In addition, as shown in FIG. 3, TPVS 150*a* can optionally include a substrate, such as a printed circuit board 170 disposed and configured to fit within the body of the TPVS 150*a*. In this example, the small printed circuit board 170 includes one or more capacitors. In this example, a single capacitor 172 is disposed on board 170 and serves as the "low side" (C2) capacitor of a capacitive voltage divider, schematically illustrated in FIG. 4. Alternatively, the low side capacitor 172 (or C2) can simply be coupled to the ground wire 164 without the need for a circuit board 170. In a further embodiment, the low side capacitor 172 can comprise one or more capacitors.

Further, in this example, TPVS 150 includes a signal output cable 160 that comprises a signal wire 161, which provides a low voltage signal, which may correspond to the voltage across the one or more low voltage capacitors, to an analytics device, such as a data acquisition device or sensor analytics unit (not shown), and optionally, a neutral/ground wire 163 to couple to ground of the data analytics unit. In this example, and as schematically shown in FIG. 4, signal wire 161 provides a low voltage signal from pressure pad 155 which is in electrical contact with the BIP contact point 132 (capacitively-coupled voltage output). In addition, ground wire 164 is to be connected to a local/cable accessory ground.

As mentioned above, BIP 130 can comprise a conventional or modified BIP or end plug. If the BIP 130 comprises a conventional BIP, having a capacitance C, the TPVS can detect the voltage signal and waveform, where the resulting voltage data signal from the TPVS may be uncalibrated. If there is an independent measurement of the voltage to provide the system a calibration factor, an accurate value of the signal voltage amplitude can be determined and correlated to the line voltage. By measuring temperature at an insulating plug attached to the TPVS, a temperature correction factor may be utilized. It is noted, however, that a conventional BIP or end plug may drift more in temperature than a modified end plug having a capacitor, making the resulting voltage data signal temperature dependent If the BIP 130 comprises a modified BIP, having a one or more capacitors with a known capacitance, such as is described in PCT Patent Pub. No. WO 2018/211358, incorporated by reference herein in its entirety, the output signal could be calibrated (if a calibration factor is determined). Non-limiting examples of the voltage rating for such a high voltage capacitor(s) C1 includes ratings of at least about 2.5 kV, about 3 kV, about 5 kV, about 10 kV, about 15 kV, about 20 kV, about 25 kV, or about 30 kV.

In some embodiments, the high voltage capacitor(s) C1 has a capacitance that may be selected in a range from about 10 pF to about 100 pF. Non-limiting examples of the capacitance include about 10 pF, about 30 pF, about 50 pF, about 70 pF, and about 90 pF. C1 also has an impedance. The magnitude of the impedance at a base frequency (for example, 50/60 Hz) may be equal to a large impedance value, such as about 100 MΩ. C1 may comprise one or more ceramic capacitors. Ceramic capacitors may provide accuracy and stability over the operating temperature range. Non-limiting examples of types of ceramic capacitors include class 1 dielectrics, such as C0G/NP0.

Low side capacitor(s) 172 (C2) has a capacitance that may be selected in a range from about 10 nF to about 1 µF. Non-limiting examples of the capacitance include about 10 nF, 0.1 µF, about 0.3 µF, about 0.5 µF, about 0.7 µF, and about 0.9 µF. The capacitance value may be selected to provide a capacitance ratio of the high voltage capacitor(s) C1 to the low voltage capacitor(s) C2 of about 100:1, about 1,000:1, about 10,000:1, or about 100,000:1. Capacitor(s) 172 has an impedance, where the magnitude of the impedance at the base frequency (for example, 50/60 Hz) may be equal to a low impedance, such as about 10 kΩ Capacitor(s) 172 (C2) may comprise one or more ceramic capacitors. Ceramic capacitors may provide accuracy and stability over the operating temperature range. Capacitor 172 may comprise a surface mount capacitor. Based on these values, the voltage data signal may have a maximum voltage less than or equal to about 0.5 V, about 1 V, about 10 V, about 42 V, about 100 V, or about 300 V.

Non-limiting examples of the operating temperature range for the TPVS include a lower end equal to or greater than about −40° C., about −30° C., about −20° C., about −5° C., or higher. Non-limiting examples of the operating temperature range include a higher end equal to or less than about 105° C., about 85° C., about 65° C., about 40° C., or lower. Non-limiting examples of the operating temperature range include being between about −5° C. to about 40° C., about −20° C. to about 65° C., about −30° C. to about 85° C., about −40° C. to about 65° C., and about −40° C. to about 105° C.

The TPVS 150*a* may have a voltage rating, or be rated, to operate in high voltage systems, such as system 100. The voltage rating may be designed to meet a standard, jurisdictional requirement, or end-user requirement. Non-limiting examples of the voltage rating of the TPVS in a three-phase system include about 2.5 kV, about 3 kV, about 5 kV, about 15 kV, about 25 kV, about 28 kV, about 35 kV, or about 69 kV or more (classified as phase-to-phase rms). In some embodiments, the voltage rating is at least 5 kV.

In some aspects, the frequency range over which the TPVS is sufficiently accurate may be described as an operating frequency range. The frequency response may be flat or substantially flat, which may correspond to minimum variation, over the operating frequency range. Non-limiting examples of flatness may include plus or minus (+/−) about 3 dB, about 1 dB, about 0.5 dB, and about 0.1 dB. The frequency response may be designed to meet a standard, jurisdictional requirement, or end-user requirement. The operating frequency range may extend to about the 50th harmonic, or even up to the 63rd harmonic, of a base frequency of the high voltage signal present in the separable connector 104. Non-limiting examples of the operating frequency range may include one or more of the base frequency of about 60 Hz (or about 50 Hz), the 50th harmonic of about 3 kHz (or about 2.5 kHz), the 63rd harmonic of about 3.8 kHz (or about 3.2 kHz), and higher. The frequency response may also remain stable over all or substantially all of the operating temperature range. Certain remote terminal units (RTUs) or intelligent electronic devices (IEDs) may analyze and report these higher order harmonics.

TPVS 150*a* can further include an eyelet or hole 162 configured to receive a hook feature of a conventional "hot stick" or insulated pole (not shown). For example, a technician can identify an existing location in the grid to monitor voltage, current, and or power. The technician can remove an existing end cap from an installed BIP or end plug using a hot stick. The technician can then replace the existing end cap with the grounded TPVS using the hot stick to place the TPVS over the test point or BIP and cable accessory receptacle outer wall surface. The signal/neutral/ground wires from the TPVS can be connected to the appropriate monitoring/analytics device or ground location to begin data monitoring/collection. In this manner, TPVS 150 can be installed onto a BIP 130 without having to take a power outage.

Figure 5:
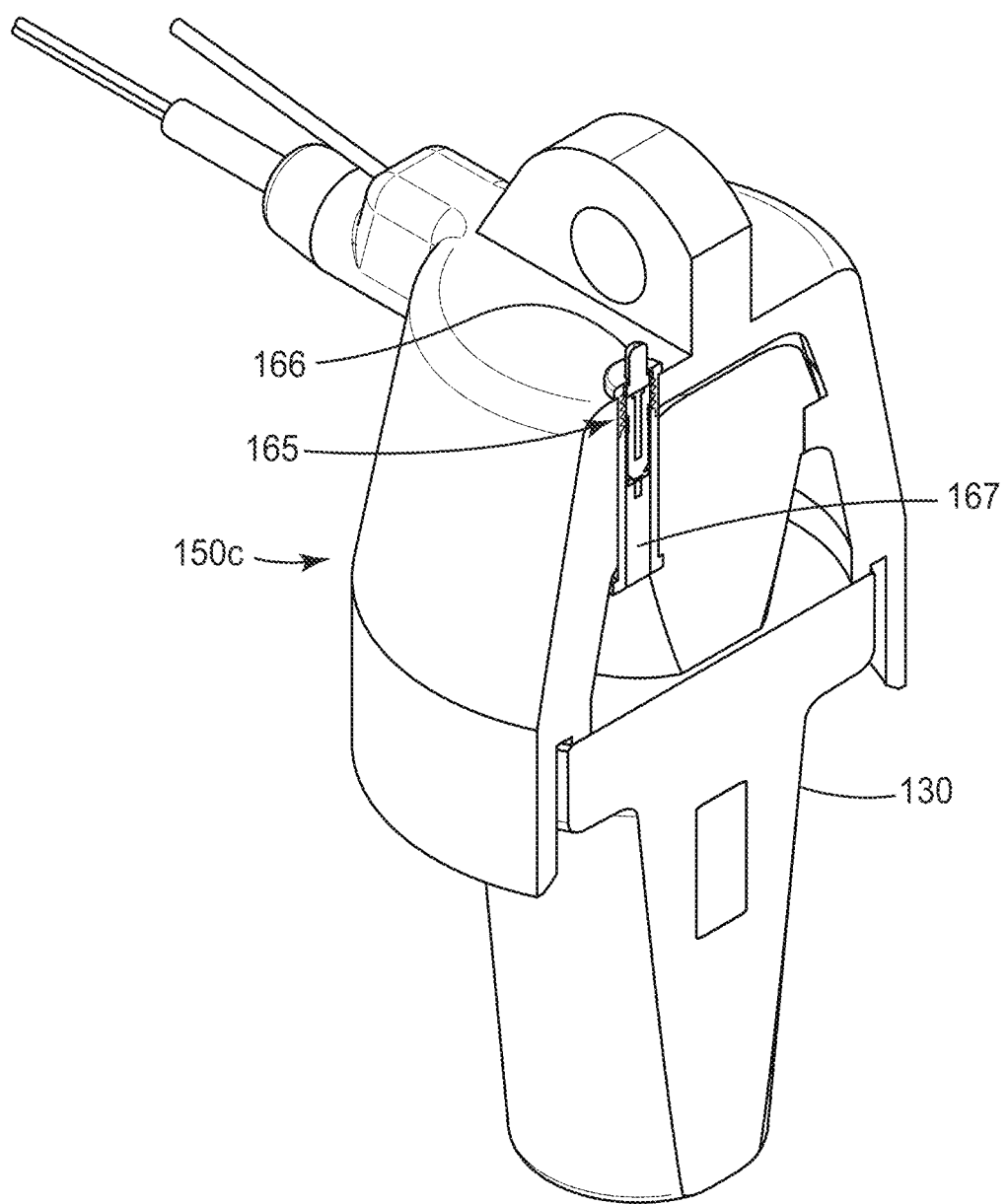
FIG. 5 is a cross section view of another test point voltage sensor installed on a basic insulation plug according to another aspect of the present invention.

In a further alternative aspect, a TPVS 150*c* can be utilized to provide consistent sealing when in use and provide ease of installation/removal. As shown in FIG. 5, TPVS 150*c* can include a one-way air valve 165 disposed in an air shaft 167 formed in the body of TPVS 150*c*. The valve includes a release pin 166 that opens the valve when depressed/activated and allows air flow through shaft 167. When the release pin 166 is not depressed/activated, air flow through shaft 167 is blocked. During installation, the technician can replace an existing end cap with the grounded TPVS 150*c* using the hot stick to place the TPVS 150*c* over the test point or BIP and cable accessory receptacle outer wall surface. The hot stick can have a flat surface on the hook end and can depress the release pin 166 when placing the TPVS 150*c* over the test point/BIP/receptacle. The air flow through the TPVS body allows for straightforward installation. When the hot stick is removed, and the release pin returns to its "closed" position, air flow through the TPVS 150*c* is blocked by valve 165, thus creating a strong suction seal. When removing TPVS 150*c*, the hot stick can activate the valve 165/release pin 166, opening air flow and removing the suction, thus allowing for more straightforward removal of the TPVS 150*c*. Alternative valve constructions and orientations can also be utilized, as would be apparent to one of ordinary skill in the art given the present description.

Thus, the test point voltage sensor 150*a*, 150*b*, 150*c* allows the deployment of a retrofittable voltage sensor to the distribution grid without the utility/customer having to take an outage. While the voltage signal may not be highly accurate, due to the variability in the BIP/end plug capacitance value, the output does scale with the line voltage. The TPVS can provide a sufficient voltage signal so that the monitoring hardware/analytics unit can detect, at least, faults, power flow, and power quality. If calibrated, the TPVS can also detect relatively accurate voltage magnitude. The capacitive voltage divider of the TPVS may facilitate measurements beyond the base or fundamental frequency and may facilitate the use of standard high-voltage DC commissioning testing without additional leakage current through the voltage divider. The TPVS may be utilized in smart grid applications.

The exemplary TPVS configurations described herein may be utilized in a number of different separable connector products and test points, including shielded terminations, specifically, 200A or 600A separable connectors. In addition, the sensors and products incorporating such sensors can be utilized in a network, such as an electrical grid network.

Figure 6:
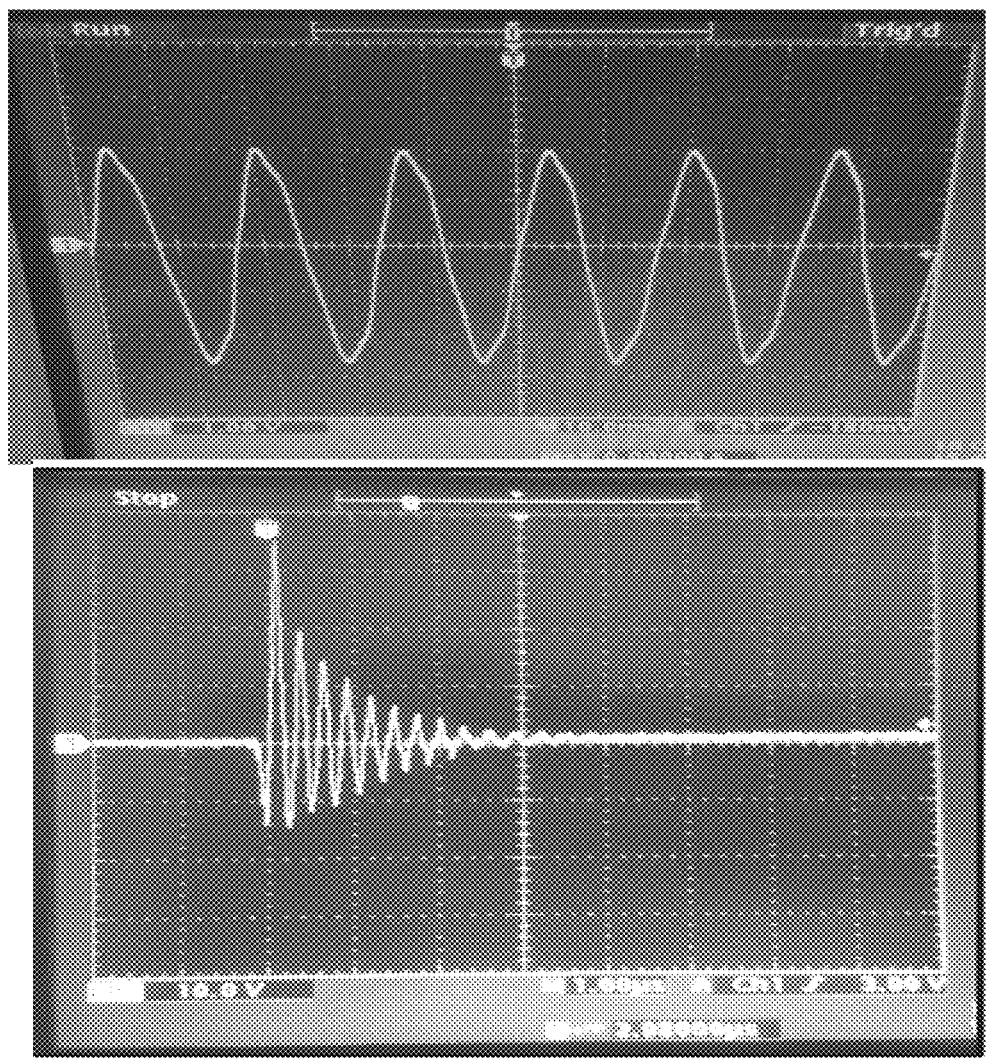
FIG. 6 is a voltage output of an example TPVS during a withstand test.

In one example, a TPVS constructed in a manner similar to the device described above, was tested. The upper image of FIG. 6 shows the voltage output of an example TPVS during a 40 kV voltage withstand. The lower image shows signal capture during +125 kV impulse testing per IEEE 386 standard.

Those skilled in the art will appreciate that various adaptations and modifications of the exemplary and alternative embodiments described herein can be configured without departing from the scope of the invention. Therefore, it is to be understood that, within the scope of the appended claims, the invention may be practiced other than as specifically described herein. For example, the example embodiments described herein may be combined in a variety of ways with each other.

All references and publications cited herein are expressly incorporated herein by reference in their entirety into this disclosure, except to the extent they may directly contradict this disclosure.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (for example 1 to 5 includes 1, 1.5, 2, 2.75, 3, 3.80, 4, and 5) and any range within that range. Herein, the terms "up to" or "no greater than" a number (for example, up to 50) includes the number (for example, 50), and the term "no less than" a number (for example, no less than 5) includes the number (for example, 5).

Terms related to orientation, such as "end", are used to describe relative positions of components and are not meant to limit the orientation of the embodiments contemplated.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open-ended sense, and generally mean "including, but not limited to". It will be understood that "consisting essentially of", "consisting of", and the like are subsumed in "comprising," and the like.

The term "and/or" means one or all of the listed elements or a combination of any two or more of the listed elements (for example, casting and/or treating an alloy means casting, treating, or both casting and treating the alloy).

The phrases "at least one of," "comprises at least one of," and "one or more of" followed by a list refers to any one of the items in the list and any combination of two or more items in the list.

What is claimed is:

1. A device to measure the voltage at a test point, comprising:
    a housing formed from a first material and a second material, wherein the first material comprises an insulating material and the second material comprises a conductive or semiconductive material, the housing having an opening configured to cover a test point of a cable accessory;
    a pressure pad, disposed in the housing, having a conductive mating surface configured to contact the test point;
    a low side capacitor embedded in the housing and electrically coupled to the conductive mating surface; and
    a signal wire electrically coupled to the low side capacitor.

2. The device of claim 1, further comprising a ground reference wire.

3. The device according to claim 1, further comprising a compression device coupled to the pressure pad to provide a pressing force on the conductive mating surface.

4. The device according to claim 1, wherein the conductive mating surface further includes a plurality of surface features configured to penetrate an oxidation layer formed on the test point.

5. The device according to claim 1, wherein the housing comprises an EPDM material.

6. The device according to claim 1, wherein the housing comprises an insulating silicone material and a conductive silicone coating disposed on an outer surface thereof.

7. The device according to claim 1, wherein the test point forms an electrode of a first capacitor and the low side capacitor forms a second capacitor of a voltage dividing circuit.

8. The device according to claim 1, wherein the device provides a continuous on-line monitoring signal.

9. The device according to claim 1, wherein the low side capacitor comprises one or more low side capacitors, further comprising a ground connection electrically coupled to the one or more low side capacitors.

10. The device according to claim 1, further comprising a substrate supporting the low side capacitor.

11. The device of claim 1, wherein the test point is integrated in the cable accessory.

12. A network comprising the test point voltage sensor according to claim 1.

13. A shielded termination comprising the test point voltage sensor according to claim 1.

14. A device to measure the voltage at a test point, comprising:
    a housing formed from a first material and a second material, wherein the first material comprises an insulating material and the second material comprises a conductive or semiconductive material, the housing having an opening configured to cover a basic insulation plug or end plug disposable in a cable accessory;
    a pressure pad, disposed in the housing, having a conductive mating surface configured to contact the test point of the basic insulation plug or end plug;
    a low side capacitor embedded in the housing and electrically coupled to the conductive mating surface; and
    a signal wire electrically coupled to the low side capacitor.

15. The device according to claim 1, wherein a capacitance ratio of a high voltage capacitor disposed in the basic insulation plug or end plug to the low voltage capacitor is from about 100:1 to about 100,000:1.

16. A system for measuring the voltage of a at a location in a power grid without having to take a power outage, comprising:
    a basic insulation plug receivable in a receptacle of a cable accessory, and
    a test point voltage sensor comprising
        a housing formed from a first material and a second material, wherein the first material comprises an insulating material and the second material comprises a conductive or semiconductive material, the housing having an opening configured to cover the basic insulation plug,
        a pressure pad, disposed in the housing, having a conductive mating surface configured to contact the test point of the basic insulation plug;
        a low side capacitor embedded in the housing and electrically coupled to the conductive mating surface; and
        a signal wire electrically coupled to the low side capacitor.

17. The system of claim 16, wherein the basic insulation plug includes one or more capacitors disposed therein.

18. The system of claim 17, wherein a voltage divider circuit is established when the test point voltage sensor is mated to the test point of the basic insulation plug, wherein the one or more capacitors disposed in the basic insulation plug provide a high side capacitor relative to the low side capacitor in a capacitive voltage divider circuit.

* * * * *

UNITED STATES PATENT AND TRADEMARK OFFICE
CERTIFICATE OF CORRECTION

PATENT NO. : 11,262,387 B2
APPLICATION NO. : 16/585803
DATED : March 1, 2022
INVENTOR(S) : David Vincent Mahoney et al.

Page 1 of 1

It is certified that error appears in the above-identified patent and that said Letters Patent is hereby corrected as shown below:

In the Claims

Column 10,
Line 22, after "voltage" delete "of a".

Signed and Sealed this
Twenty-seventh Day of August, 2024

Katherine Kelly Vidal
*Director of the United States Patent and Trademark Office*